(12) United States Patent     (10) Patent No.:    US 12,695,464 B2

Mohamed et al.        (45) Date of Patent:      Jul. 28, 2026

---

(54) SIGMA-DELTA MODULATOR AND METHOD FOR OPERATING A SIGMA-DELTA MODULATOR

(71) Applicant: Robert Bosch GmbH, Stuttgart (DE)

(72) Inventors: Ayman Mohamed, Stuttgart (DE); Yunan Fu, Stuttgart (DE); Rudolf Ritter, Renningen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 159 days.

(21) Appl. No.: 18/641,888

(22) Filed: Apr. 22, 2024

(65)        Prior Publication Data

US 2024/0364358 A1     Oct. 31, 2024

(30)      Foreign Application Priority Data

Apr. 27, 2023    (DE) ..................... 10 2023 203 900.1

(51) Int. Cl.
     *H03M 3/00*       (2006.01)

(52) U.S. Cl.
     CPC ........... *H03M 3/504* (2013.01); *H03M 3/338* (2013.01)

(58) Field of Classification Search
     CPC ........ H03M 3/39; H03M 3/454; H03M 3/388; H03M 3/504
     See application file for complete search history.

(56)          References Cited

U.S. PATENT DOCUMENTS

| | | | |
|---|---|---|---|
| 6,535,153 B1 * | 3/2003 | Zierhofer | ................ H03M 3/49 |
| | | | 375/247 |
| 6,674,381 B1 * | 1/2004 | Gomez | ................. H03M 3/328 |
| | | | 341/143 |

(Continued)

FOREIGN PATENT DOCUMENTS

| | | |
|---|---|---|
| DE | 102013021956 A1 | 7/2015 |
| EP | 3641136 A1 | 4/2020 |

OTHER PUBLICATIONS

Nikas et al., "A Continuous-Time Delta-Sigma Modulator Using a Modified Instrumentation Amplifier and Current Reuse DAC for Neural Recording," IEEE Journal of Solid-State Circuits, vol. 54, No. 10, 2019, pp. 2879-2891. <https://sci-hub.ru/10.1109/jssc.2019.2931811>. Downloaded Apr. 22, 2024.

*Primary Examiner* — Lam T Mai

(74) *Attorney, Agent, or Firm* — NORTON ROSE FULBRIGHT US LLP

(57)          ABSTRACT

A sigma-delta modulator. The signal-delta modulator includes: an integrator having an instrumentation amplifier designed to receive an input signal to be modulated at a first input and to receive a feedback signal at a second input, wherein the integrator is designed to generate an integrator signal using the input signal and the feedback signal; a quantizer, which is designed to generate a quantizer signal in accordance with the integrator signal; a first FIR digital-to-analog converter, which is designed to generate the feedback signal in accordance with the quantizer signal; a first compensation device, which is designed to compensate for an excess loop delay in accordance with the quantizer signal; and a second compensation device, which comprises a second FIR digital-to-analog converter, which is designed to compensate for a clock cycle shift of the feedback signal in accordance with the quantizer signal.

10 Claims, 1 Drawing Sheet

(56) References Cited

U.S. PATENT DOCUMENTS

| | | | | |
|---|---|---|---|---|
| 6,707,409 | B1* | 3/2004 | Ignjatovic | H03M 3/402 |
| | | | | 341/143 |
| 7,119,726 | B2* | 10/2006 | Wang | H03M 3/358 |
| | | | | 341/143 |
| 7,567,192 | B2* | 7/2009 | Colmer | H03M 3/484 |
| | | | | 341/120 |
| 7,616,142 | B1* | 11/2009 | Mai | H03M 3/362 |
| | | | | 341/143 |
| 7,786,912 | B2* | 8/2010 | Rangan | H03M 3/428 |
| | | | | 341/120 |
| 7,834,787 | B2* | 11/2010 | Hong | H03M 3/37 |
| | | | | 341/200 |
| 7,880,654 | B2* | 2/2011 | Oliaei | H03M 3/374 |
| | | | | 341/143 |
| 8,223,051 | B2* | 7/2012 | Van Veldhoven | H03M 3/428 |
| | | | | 341/143 |
| 8,638,251 | B1* | 1/2014 | Hong | H03M 3/454 |
| | | | | 327/295 |
| 10,763,888 | B1* | 9/2020 | Zhang | H03M 3/352 |
| 12,088,324 | B2* | 9/2024 | Abdelaal | H03M 3/436 |
| 2005/0068213 | A1* | 3/2005 | Fontaine | H03M 3/37 |
| | | | | 341/143 |
| 2006/0087463 | A1* | 4/2006 | Wang | H03M 3/358 |
| | | | | 341/120 |
| 2007/0210948 | A1* | 9/2007 | Wang | H03M 3/37 |
| | | | | 341/143 |
| 2007/0247341 | A1* | 10/2007 | Liu | H03M 3/32 |
| | | | | 341/143 |
| 2010/0219998 | A1* | 9/2010 | Oliaei | H03M 3/37 |
| | | | | 341/143 |
| 2010/0219999 | A1* | 9/2010 | Oliaei | H03M 3/374 |
| | | | | 341/143 |
| 2010/0245144 | A1* | 9/2010 | Robbe | H03M 7/302 |
| | | | | 341/143 |
| 2010/0259431 | A1 | 10/2010 | Yu et al. | |
| 2011/0133969 | A1 | 6/2011 | Lin et al. | |
| 2012/0188107 | A1 | 7/2012 | Ashburn, Jr. et al. | |
| 2013/0207820 | A1* | 8/2013 | Maurino | H03M 3/328 |
| | | | | 341/131 |
| 2014/0368365 | A1* | 12/2014 | Quiquempoix | H03M 3/496 |
| | | | | 341/143 |
| 2020/0153451 | A1* | 5/2020 | Zhou | H03M 3/464 |
| 2021/0399737 | A1* | 12/2021 | Furenlid | H03M 3/324 |
| 2022/0302890 | A1* | 9/2022 | Ippolito | H03F 3/45475 |
| 2023/0060505 | A1* | 3/2023 | Bandyopadhyay | H03M 3/464 |
| 2023/0065453 | A1* | 3/2023 | Bandyopadhyay | H03M 3/352 |
| 2025/0093446 | A1* | 3/2025 | Wu | G01R 33/365 |
| 2025/0105856 | A1* | 3/2025 | Ortmanns | H03M 3/424 |

* cited by examiner

SIGMA-DELTA MODULATOR AND METHOD FOR OPERATING A SIGMA-DELTA MODULATOR

CROSS REFERENCE

The present application claims the benefit under 35 U.S.C. § 119 of German Patent Application No. DE 10 2023 203 900.1 filed on Apr. 27, 2023, which is expressly incorporated herein by reference in its entirety.

FIELD

The present invention relates to a sigma-delta modulator and a method for operating a sigma-delta modulator.

BACKGROUND INFORMATION

Continuous-time (CT) sigma-delta modulators are particularly suitable for meeting the requirements of analog-to-digital converters. An inherently energy-efficient architecture eliminates the need for high-speed amplification stages required for sampled analog-to-digital converters such as conventional discrete-time sigma-delta analog-to-digital converters. By utilizing the inherent oversampling of an internal low-pass CT loop filter, a substantially alias-free Nyquist band is provided.

CT integrators are the basic building blocks of the modulator loop filter of low-pass CT sigma-delta modulators. There are two practical CT integrator topologies: active RC-based integrators and Gm-C-based integrators. As a rule, the active RC circuits have better linearity and a larger output swing. A purely resistive input without switching is easier to control and introduces less noise into the overall system than the switching input capacitors of a discrete-time sigma-delta analog-to-digital converter. For sensor applications, a high input impedance of the front-end interface circuits is usually required. However, conventional active RC integrators have a limited input impedance.

In contrast to RC-based continuous-time sigma-delta modulators, the Gm-C-based continuous-time sigma-delta modulator is advantageous due to its infinite input impedance. In addition, Gm-C integrators are potentially faster and easy to tune, making them more suitable for reconfigurable applications. However, Gm-C-based modulators exhibit low linearity due to the open loop of the Gm cell, if the input signal is not small enough.

Nikas et al., "A Continuous-Time Delta-Sigma Modulator Using a Modified Instrumentation Amplifier and Current Reuse DAC for Neural Recording," IEEE Journal of Solid-State Circuits, vol. 54, no. 10, pp. 2879-2891, 2019, relates to a continuous-time sigma-delta modulator comprising an integration amplifier (IA) as the first integrator stage of the modulator, i.e., an IA-based integrator.

SUMMARY

The present invention provides a sigma-delta modulator and a method for operating a sigma-delta modulator. Preferred embodiments of the present invention are disclosed herein.

According to a first aspect, the present invention thus relates to a sigma-delta modulator. According to an example embodiment of the present invention, the sigma-delta modulator includes an integrator having an instrumentation amplifier, wherein the instrumentation amplifier is designed to receive an input signal to be modulated at a first input and to receive a feedback signal at a second input; wherein the integrator is designed to generate an integrator signal using the input signal and the feedback signal. The sigma-delta modulator further comprises a quantizer, which is designed to generate a quantizer signal in accordance with the integrator signal. The sigma-delta modulator further comprises a first finite impulse response, FIR, digital-to-analog converter, which is designed to generate the feedback signal in accordance with the quantizer signal. The sigma-delta modulator further comprises a first compensation device, which is designed to compensate for an excess loop delay in accordance with the quantizer signal. The sigma-delta modulator further comprises a second compensation device, which comprises a second FIR digital-to-analog converter, which is designed to compensate for a clock cycle shift of the feedback signal in accordance with the quantizer signal.

According to a second aspect, the present invention relates to a method for operating a sigma-delta modulator according to the first aspect, wherein an input signal to be modulated is applied to the first input of the instrumentation amplifier.

The present invention provides a sigma-delta modulator including an instrumentation amplifier-based integrator. The use of an instrumentation amplifier enables a high input impedance, common-mode rejection for large signals and a high linear input range. The present invention further makes it possible to reduce clock jitter. The use of the first FIR digital-to-analog converter is further advantageous because it is linear, even if the weights of the filter deviate from their nominal values. Therefore, a mismatch of the elements does not lead to distortions, as would be the case with a multi-bit digital-to-analog converter.

The first FIR digital-to-analog converter reduces the influence of clock jitter. The second compensation device compensates for a clock cycle shift that occurs if the feedback signal is at least partially shifted into a subsequent clock cycle due to a long delay. The first compensation device compensates for the remaining shift, i.e. within the clock cycle.

The sigma-delta modulator can also be operated with low power consumption, since only one comparator can be used.

The use of the first FIR digital-to-analog converter together with the quantizer makes it possible to effectively low-pass filter the feedback signal before the second input of the instrumentation amplifier. The filtering then reduces a large proportion of the high-frequency quantization noise. The high-frequency quantization noise, if not filtered, places strict requirements on the instrumentation amplifier in terms of high slew rate and large signal swing, which would require the use of a relatively large integration capacitor to reduce the output voltage swing of the instrumentation amplifier.

The output signal of the FIR digital-to-analog converter is similar to the output of a multi-bit digital-to-analog converter in terms of the smaller voltage jumps between the successive time steps. However, the FIR digital-to-analog converter is linear and does not require complex calibration routines or dynamic methods to mitigate non-linearity, as is the case with multi-bit digital-to-analog converters. In addition, the FIR digital-to-analog converter increases the robustness of the sigma-delta modulator against clock fluctuations (jitter), since the voltage jumps between two sampling processes are smaller.

Since the instrumentation amplifier processes the difference between the input signal and the feedback signal, wherein the feedback signal contains the input signal and only a small amount of quantization noise, thanks to FIR feedback, the effective input voltage to the instrumentation amplifier is reduced, as a result of which the requirements for slew rate are lowered. In addition, due to the smaller input signal, a small integration capacitor can be integrated into the feedback of the instrumentation amplifier, which in turn reduces the space requirement.

According to a further development of the sigma-delta modulator of the present invention, the first compensation device comprises a half-return-to-zero digital-to-analog converter.

According to a further development of the sigma-delta modulator of the present invention, the first compensation device and the second compensation device are connected in parallel.

According to a further development of the present invention, the sigma-delta modulator comprises a subtractor, which is designed to subtract a combination of an output signal of the first compensation device and an output signal of the second compensation device from the integrator signal before it is provided to the quantizer.

According to a further development of the present invention, the sigma-delta modulator comprises a delay device, which is designed to delay the quantizer signal before it is provided to the first compensation device, the second compensation device and the first FIR digital-to-analog converter. Preferably, the delay device delays the quantizer signal by half a clock frequency. As a result, the sigma-delta modulator is stabilized.

According to a further development of the sigma-delta modulator of the present invention, the quantizer is a 1-bit quantizer. By using a 1-bit quantizer with FIR feedback, the advantages of single-bit operation and multi-bit operation can be combined.

According to a further development of the sigma-delta modulator of the present invention, the integrator also has a feedback capacitor, which is connected between the second input of the instrumentation amplifier and an output of the instrumentation amplifier.

According to a further development of the present invention, the sigma-delta modulator comprises a common-mode voltage source, which is coupled to the first input of the instrumentation amplifier via a resistor.

According to a further development of the present invention, the sigma-delta modulator is a continuous-time sigma-delta modulator.

Further advantages, features and details of the present invention will become apparent from the following description, in which various exemplary embodiments are described in detail with reference to the figures.

DETAILED DESCRIPTION OF EXAMPLE EMBODIMENTS

Figure 1:
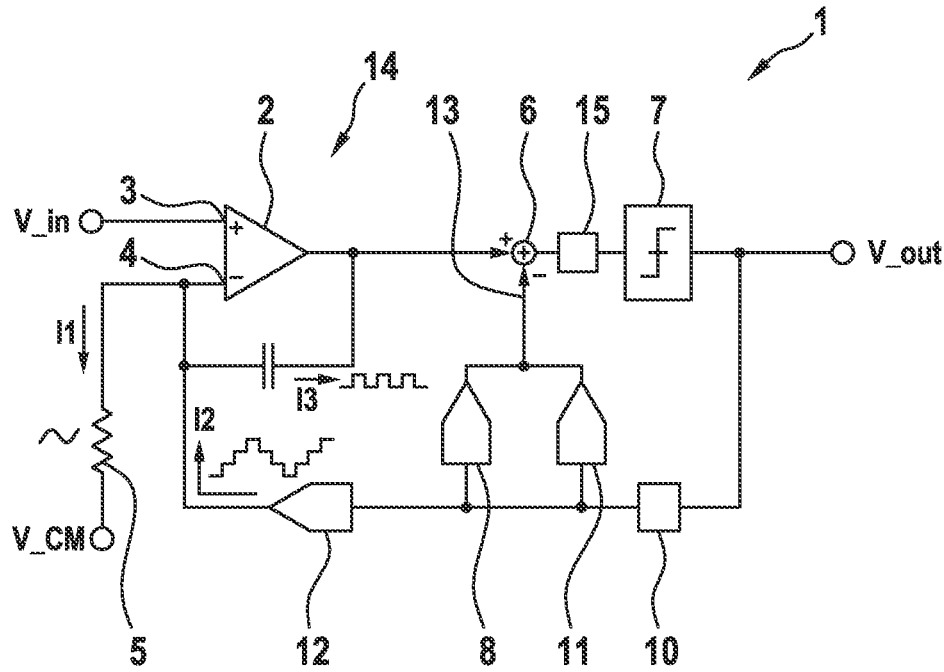
FIG. 1 shows a schematic circuit diagram of a sigma-delta modulator according to one example embodiment of the present invention

FIG. 1 shows a schematic circuit diagram of a continuous-time sigma-delta modulator 1. This comprises an integrator 14 comprising an instrumentation amplifier 2. The instrumentation amplifier 2 receives an input signal V_in at a first input 3, which signal is to be modulated. The instrumentation amplifier 2 also comprises a second input 4. A common-mode (CM) voltage source V_CM is coupled to the first input 4 of the instrumentation amplifier via a resistor 5. Furthermore, a feedback signal is provided at the second input 4.

A current flows through the resistor 5:

$$I1 = (V\_in - V\_CM)/R1,$$

where R1 denotes the resistance value of resistor 5.

The instrumentation amplifier 2 is in this case a differential amplifier, wherein an output of the instrumentation amplifier 2 is coupled to the second input of the instrumentation amplifier 2 via a feedback capacitor 9. The current flowing through the feedback capacitor is given by:

$$I3 = I1 - I2,$$

where I2 denotes the current of the feedback signal. Thus, the integrator 14 generates an integrator signal using the input signal and the feedback signal.

The sigma-delta modulator 1 comprises a further integrator 15 for processing the integrator signal, in particular an RC integrator. Thus, it can be a second-order delta-sigma modulator.

The sigma-delta modulator 1 also comprises a quantizer 7, which generates a quantizer signal in accordance with the integrator signal. The quantizer 7 is preferably a 1-bit quantizer. Due to the high loop gain, the quantizer 7 outputs a digital bit stream, which consists of the signal component along with the shaped quantization noise.

The quantizer signal is output as output signal V_out of the sigma-delta modulator 1. The quantizer signal is also fed into a feedback loop.

For this purpose, the sigma-delta modulator 1 comprises a first finite impulse response, FIR, digital-to-analog converter 12, which generates the feedback signal in accordance with the quantizer signal. The first FIR digital-to-analog converter 12 is used as a low-pass filter, which filters the quantizer signal provided by the quantizer 7, as a result of which a feedback signal with a step-shaped current I2 is produced, similar to the use of a multi-bit quantizer and a multi-bit digital-to-analog converter. This also has the same effects on the slew rate, the linearity of the integrator and the size of the feedback capacitance. Furthermore, a high linearity of the first FIR digital-to-analog converter 12 is obtained.

The sigma-delta modulator 1 further comprises a first compensation device 8 and a second compensation device 11.

The first compensation device 8 is designed to compensate for an excess loop delay (ELD) in accordance with the quantizer signal through coefficient adjustment. The first compensation device 8 preferably comprises a half-return-to-zero digital-to-analog converter.

The second compensation device 11 comprises a second FIR digital-to-analog converter, which is designed to compensate, in accordance with the quantizer signal, for a change in a noise transfer function of the sigma-delta modulator 1 caused by the low-pass filtering of the first FIR digital-to-analog converter 12. The second compensation device 11 compensates for a clock cycle shift in the feedback signal. As a result, the sigma-delta modulator 1 remains stable and the desired noise transfer function is maintained.

The first compensation device 11 and the second compensation device 8 are connected in parallel. The sigma-delta modulator 1 also comprises a subtractor 6. An output signal from the first compensation device 8 is initially combined with an output signal from the second compensation device 11. This combined signal 13 is subtracted from the integrator signal before it is provided to the second integrator 15 and the quantizer 7.

The sigma-delta modulator 1 further comprises a delay device 10, which delays the quantizer signal before it is provided to the first compensation device 8, the second compensation device 11 and the first FIR digital-to-analog converter 12.

Figure 2:
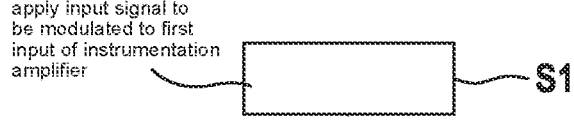
FIG. 2 shows a flow diagram of a method for operating a sigma-delta modulator according to one example embodiment of the present invention.

FIG. 2 shows a flow diagram of a method for operating a sigma-delta modulator, in particular the sigma-delta modulator 1 described above. The sigma-delta modulator 1 thus comprises in particular an integrator 14 comprising an instrumentation amplifier 2, a quantizer 7, a first FIR digital-to-analog converter 12, a first compensation device 8 and a second compensation device 11, as described above.

In a method step S1, an input signal to be modulated is applied to the first input of the instrumentation amplifier 2.

In accordance with an input signal, the sigma-delta modulator 1 generates an output signal V_out.

What is claimed is:

1. A sigma-delta modulator, comprising:

an integrator, which includes an instrumentation amplifier which is configured to receive an input signal to be modulated at a first input and to receive a feedback signal at a second input, wherein the integrator is configured to generate an integrator signal using the input signal and the feedback signal;

a quantizer configured to generate a quantizer signal in accordance with the integrator signal;

a first finite impulse response (FIR) digital-to-analog converter, which is configured to generate the feedback signal in accordance with the quantizer signal;

a first compensation device, which is configured to compensate for an excess loop delay in accordance with the quantizer signal; and a second compensation device, which includes a second FIR digital-to-analog converter, which is configured to compensate for a clock cycle shift of the feedback signal in accordance with the quantizer signal, wherein the instrumentation amplifier is configured to provide a high input impedance and a high linear input range for the input signal.

2. The sigma-delta modulator according to claim 1, wherein the first compensation device includes a half-return-to-zero digital-to-analog converter.

3. The sigma-delta modulator according to claim 1, wherein the first compensation device and the second compensation device are connected in parallel.

4. The sigma-delta modulator according to claim 3, further comprising a subtractor, which is configured to subtract a combination of an output signal of the first compensation device and an output signal of the second compensation device from the integrator signal before the integrator signal is provided to the quantizer.

5. The sigma-delta modulator according to claim 1, further comprising a delay device, which is configured to delay the quantizer signal before the quantizer signal is provided to the first compensation device, the second compensation device and the first FIR digital-to-analog converter.

6. The sigma-delta modulator according to claim 1, wherein the quantizer is a 1-bit quantizer.

7. The sigma-delta modulator according to claim 1, wherein the integrator further has a feedback capacitor, which is connected between the second input of the instrumentation amplifier and an output of the instrumentation amplifier.

8. The sigma-delta modulator according to claim 1, comprising a common-mode voltage source, which is coupled to the second input of the instrumentation amplifier via a resistor.

9. The sigma-delta modulator according to claim 1, wherein the sigma-delta modulator is a continuous-time sigma-delta modulator.

10. A method for operating a sigma-delta modulator, the sigma-delta modulator including:

an integrator, which includes an instrumentation amplifier which is configured to receive an input signal to be modulated at a first input and to receive a feedback signal at a second input, wherein the integrator is configured to generate an integrator signal using the input signal and the feedback signal, a quantizer configured to generate a quantizer signal in accordance with the integrator signal, a first finite impulse response (FIR) digital-to-analog converter, which is configured to generate the feedback signal in accordance with the quantizer signal;

a first compensation device, which is configured to compensate for an excess loop delay in accordance with the quantizer signal, and a second compensation device, which includes a second FIR digital-to-analog converter, which is configured to compensate for a clock cycle shift of the feedback signal in accordance with the quantizer signal;

the method comprising the following steps:

applying the input signal to be modulated to the first input of the instrumentation amplifier, wherein the instrumentation amplifier is configured to provide a high input impedance and a high linear input range for the input signal.

\* \* \* \* \*